Aug. 3, 1965 M. S. MASSE ETAL 3,199,059

ELECTRICAL CONNECTOR HINGE

Filed Jan. 22, 1962

INVENTORS.
Jerome B. Murray
Michel S. Masse
Mueller & Aichele
Attys.

United States Patent Office 3,199,059
Patented Aug. 3, 1965

3,199,059
ELECTRICAL CONNECTOR HINGE

Michel S. Masse, Hollywood, and Jerome B. Murray, Los Angeles, Calif., assignors, by mesne assignments, to The Bendix Corporation, Baltimore, Md., a corporation of Delaware Filed Jan. 22, 1962, Ser. No. 167,645
2 Claims. (Cl. 339—4)

This invention relates in general to electrical circuit apparatus and in particular to an electrical connector hinge device for mechanically and electrically interconnecting printed circuit boards.

Sub-miniaturization of circuit components together with printed circuit boards has substantially reduced the size of assemblies for electronic circuitry. Such assemblies not only offer a substantial savings in space requirements but also effect a significant improvement in the reliability of operation as well as reducing the weight considerations. They are particularly advantageous in aircraft applications where space and weight are at a decided premium.

In a complex circuit arrangement, such as two-way radio communication equipment or electronic instrumentation apparatus, a number of printed circuit boards may be arranged in closely spaced arrays or banks. Each board with associated miniaturized electronic components mounted thereon represents a particular portion of the overall circuitry. A problem has been presented in the past, however, in effecting an acceptable compromise between desirable compactness and necessary serviceability. If the circuit boards are so spaced for optimum compactness, serviceability may be impaired due to the difficulty in gaining access to the individual boards and associated components. If the boards are arranged for convenient access, the compactness thereof must necessarily be sacrificed.

It is therefore an object of the present invention to provide a connecting arrangement for printed circuit boards whereby a compact, high-density packaging arrangement may be effected without sacrificing serviceability.

Another object is to provide an electrical connector hinge for electrically and mechanically interconnecting circuits on printed circuit boards whereby such boards may be positioned in any desirable angle in relation to each other to facilitate servicing.

Still another object is to provide a new and improved method of pivotally interconnecting printed circuit boards without separate cable and connector assemblies thereby eliminating attendant wire lead breakage due to flexing.

A feature of the present invention is the provision of a connector hinge assembly which includes a plurality of metallic hinge loops disposed as pairs on a support shaft of insulating material. Each hinge loop pair includes a first limb adapted for connection to a first circuit board and a second limb connected to a second circuit board whereby the interconnected circuit boards may be folded in any given relation to each other about the axis of the support shaft.

Another feature is the provision of such a connector hinge wherein a plurality of tubular insulating sections interspace pairs of conducting hinge loops on an insulated support shaft in a given relation, and wherein one limb of each hinge loop pair includes a concave curvature to form a resilient contact with the other limb thereby facilitating the pivotable action while maintaining positive electrical contact between the hinge loop limbs and therefore between the circuit boards so interconnected.

In practicing the invention an improved connector hinge apparatus is provided for electrically and mechanically interconnecting printed circuit boards without separate cable and connector assemblies. The hinge assembly consists of a support tube of insulating material for receiving a threadable lock shaft therethrough. Mounted as integral pairs on the support tube are a plurality of metallic hinge loops or rings interspaced in a given relationship by a plurality of tubular sections of insulating material which are adapted for insertion on the support tube. Each hinge loop pair includes a first limb adapted for connection to one circuit board and a second limb for connecting to a second circuit board whereby the circuit boards so interconnected may be folded about the axis of the support tube in any desired relationship to each other. Further, one such limb of the hinge loop pair has a resilient concave configuration in the base portion thereof to facilitate such pivoting action by forming a resilient cushion at each hinge loop joint as well as insuring positive electrical contact between integral limb members.

Figure 1:
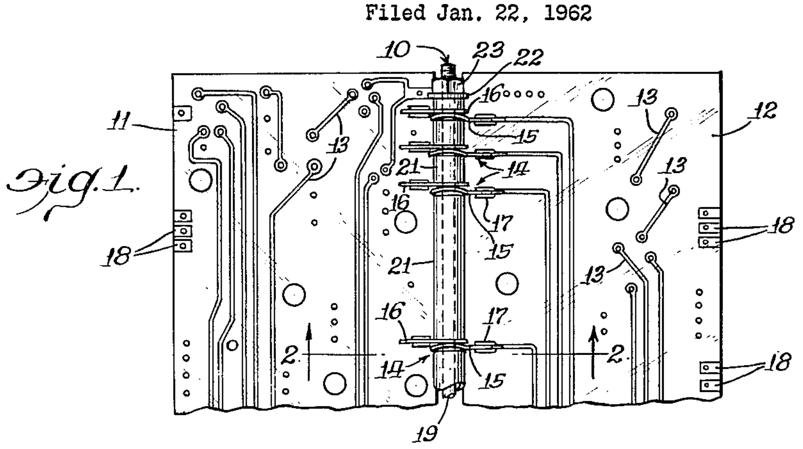
FIG. 1 is a top sectional view of two circuit boards interconnected by the present invention.

Referring to FIG. 1, connector hinge apparatus 10 extends lengthwise between printed circuit boards 11 and 12. The circuit boards are of the type having a plurality of generally parallel conducting strips 13 etched on the surface of a flat plate of suitable dielectric material such as Bakelite or the like. The conducting strips serve to connect various circuit components in a particular relation, not shown, but which it will be understood to be affixed to circuit boards 11 and 12 in a known manner. The configuration of the conducting strips is arranged so as to provide the particular portion of electronic circuitry desired.

Connector hinge 10 includes a plurality of hinge loop or ring pairs 14 consisting of ring members 15 and 16 and adapted for electrically and mechanically interconnecting printed circuit boards 11 and 12. The printed circuit boards include a plurality of eyelets identified generally as numeral 17 positioned along the sides of circuit boards 11 and 12 wherein end portions 15*a* and 16*a* of hinge rings 15 and 16 are insertable for soldering therein (as shown in FIGS. 2 and 3).

Figures 2, 3, 4, 5, 6:
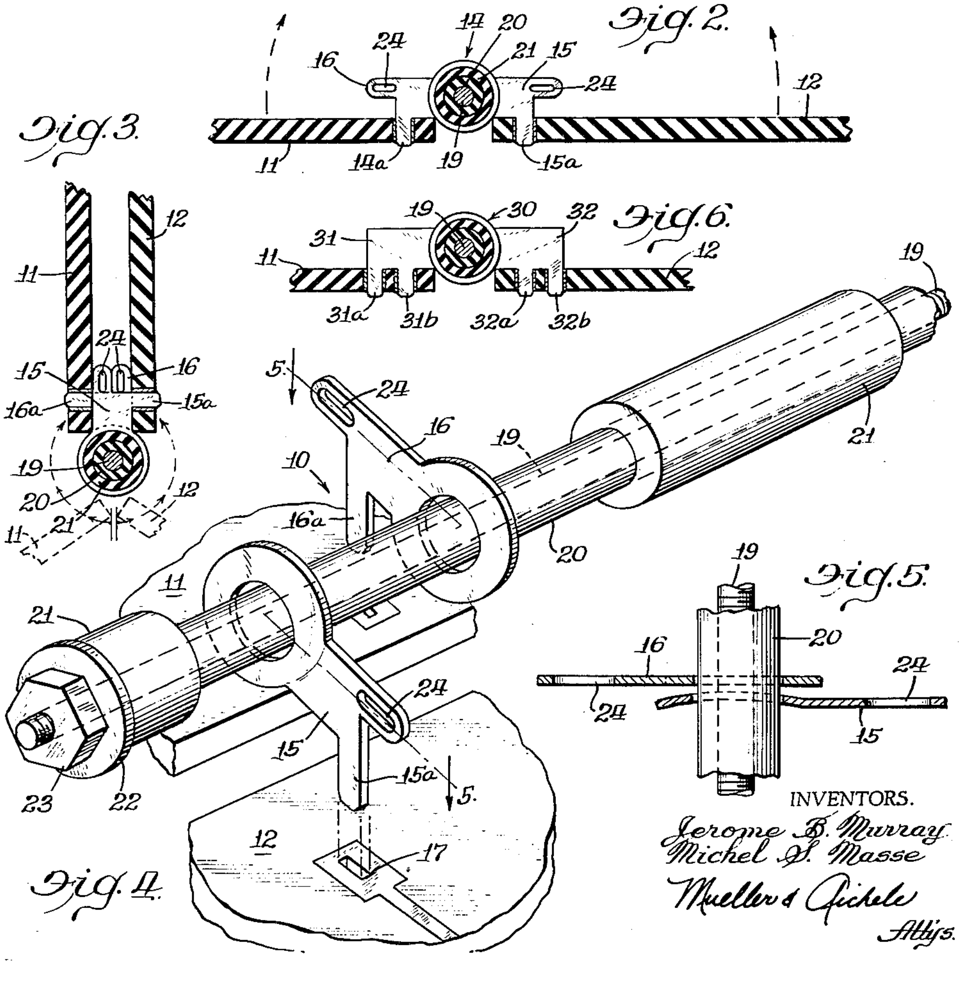
FIG. 2 is a side cross sectional view taken along lines 2—2 of FIG. 1.
FIG. 3 is a side cross sectional view of the connector apparatus with the circuit boards in a folded relation.
FIG. 4 is an exploded view of a portion of the connector hinge assembly.
FIG. 5 is a cross sectional view of a connector hinge loop limb pair taken along lines 5—5 of FIG. 4.
FIG. 6 is a side cross sectional view of another embodiment of the connector hinge.

As shown more clearly in FIG. 4, connector hinge apparatus 10 consists of a tubular shaft 20 of insulating material through which extends a lock rod 19 threaded at each end. A plurality of metallic hinge ring members 15 and 16 having an opening therein are disposed as integral pairs on support shaft 20. Each ring member is constructed in an essentially L-shaped configuration and assembled on support shaft 20 in a manner so as to extend in opposing directions in the fully open position. A plurality of tubular sections 21 constructed of insulating material and having an approximate inner diameter equal to the outer diameter of support shaft 20 are inserted thereon.

As best shown in FIG. 1, tubular sections 21 are interspaced between hinge ring pairs 14. Each tubular section 21 has a given dimensional length whereby the hinge ring pairs are positioned on support shaft 20 in a particular spaced relationship. A washer 22, abutting the endmost tubular section 21 at each end, and a nut 23, cooperating with the ring rod 19, secures the connector hinge apparatus 10 as a single integral unit. With end portion 15*a* of ring member 15 affixed within appropriate eyelets 17 on circuit board 11 and end portion 16*a* of loop member 16 affixed within similar associated eyelets on circuit board 12, the circuit boards may be pivoted or folded around the axis of support shaft 20 in any given relation to each other within a circle of approximately 270 degrees (as shown in FIG. 3).

Further, the boards may be conveniently interconnected electrically in any desired manner by reason of the electrical continuity which is maintained between ring members 15 and 16 in each hinge loop pair 14. Each hinge ring pair is effectively insulated from one another by tubular spacer 21 and support shaft 20 which are constructed of suitable insulating materials. From FIG. 5 it will be noted that each hinge ring member 15 is constructed with a concave curvature in the circular base portion, thereby forming a resilient cushion in cooperation with the base portion of ring member 16. This cushioning action effectively compensates for tolerance differences between the hinge ring pairs 14 and tubular spacers 21 as well as facilitating the pivoting action between the interconnected circuit boards. Further, positive electrical continuity is insured by the resilient pressure between ring members 15 and 16 at all times.

Each of the ring members 15 and 16 may include a projecting end portion having a rectangular slot 24 therein (FIGS. 2 and 4). Appropriate electrical leads may be positioned lengthwise along the connector hinge apparatus 10 and connected to ring members 15 and 16 by being inserted in slots 24 and soldered therein. In subsequent pivoting and flexing circuit boards 11 and 12, the electrical leads so connected will remain substantially stationary thereby eliminating attendant wire lead breakage and the like while increasing the flexibility of servicing the circuit boards.

It is to be emphasized, however, that ring members 15 and 16 are not limited to the above configuration. Rectangular slots 24 may be included in both of ring members 15 and 16 as described, in only one of the ring members, or in neither, as shown in FIG. 6. In the latter construction, the associated electrical leads may be connected to eyelets 18 positioned along the sides of circuit boards 11 and 12 (FIG. 1), either by direct soldering or through other suitable connector apparatus (not shown); the electrical leads may also be soldered directly in the eyelets of conductor strips 13 in one or both of circuit boards 11 and 12.

FIG. 6 also shows another construction for the hinge rings if greater mechanical strength is desired. In this embodiment, each hinge ring pair 30 includes loop members 31 and 32, each of which has a pair of end portions 31*a*, 31*b* and 32*a*, 32*b* respectively. The end portions may then be soldered in provided eyelets in circuit boards 11 and 12 in the manner shown.

In addition, it is to be further emphasized that the present invention is not limited to the interconnection of only two such circuit boards. A similar connector hinge may be affixed to either or both of circuit boards 11 and 12 in the manner previously described to any given number of interconnected circuit boards which may be folded or pivoted in like manner around the axis of the added connector hinges.

The present invention therefore provides an improved method of electrically and mechanically interconnecting a number of printed circuit boards such that both the desired degree of compactness and serviceability is readily obtained. A plurality of hinge loops or rings may be disposed as pairs on a support shaft to meet the physical configurations of any circuit board requirements. The invention is economical in manufacture and is not dependent upon close tolerances for proper operation.

We claim:

1. Printed circuit board apparatus including in combination, a plurality of circuit boards having eyelets along the sides thereof, an elongated support shaft of insulating material, a plurality of metallic conducting hinges each having a ring-shaped mounting portion with an integral extension thereon and a connecting finger extending normally thereto, said hinges being mounted as pairs with said support shaft extending through said ring-shaped portions, said hinges being interspaced in a desired relationship by a plurality of tubular spacers on said support shaft, said ring-shaped portion of one of said hinges in each of said pairs being of curved resilient configuration and cooperating with the ring-shaped portion of the other hinge of said pair to provide resilient contact therebetween, said extensions of said hinges being adapted for electrical connection to respective ones of said printed circuit boards with said connecting fingers thereon extending into said eyelets on said boards to provide mechanical support for said boards such that said boards are pivotal about the axis of said support shaft, said resilient contact between said hinges of each of said pairs facilitating said pivoting action and maintaining positive electrical continuity between said hinges, thereby permitting electrical connection of said printed circuit boards.

2. Electrical connector hinge apparatus for mechanically and electrically interconnecting printed circuit boards of the type having conductor strips thereon, said connector hinge including in combination, an elongated support shaft of insulating material, a plurality of L-shaped metallic hinges each having a base portion with an opening therein for mounting on said support shaft, a plurality of tubular spacers of insulating material interspacing pairs of said hinges on said support shaft in a given relationship, one of said hinges in each pair having a curvature formed in its base portion whereby a resilient contact is formed between the base portions of said hinges in each pair, one of said hinges in each pair being mechanically and electrically connected to one of said circuit boards with the other of said hinges being similarly connected to another of said circuit boards, said circuit boards being pivotal around the axis of said support shaft in any given relationship to each other, said resilient contact between said hinges facilitating said pivoting action and maintaining positive electrical continuity between said hinges, thereby permitting electrical interconnection of said circuit boards.

References Cited by the Examiner

UNITED STATES PATENTS

| | | | |
|---|---|---|---|
| 1,631,994 | 6/27 | Warner | 339—2 |
| 2,341,459 | 2/44 | Martin. | |
| 2,477,901 | 8/49 | Robboy. | |
| 2,740,097 | 3/56 | Edelman et al. | 339—4 X |

JOSEPH D. SEERS, *Primary Examiner.*